United States Patent
de la Torre

(10) Patent No.: US 11,715,354 B2
(45) Date of Patent: Aug. 1, 2023

(54) SOUNDER DYNAMIC VOLUME ADJUSTMENT

(71) Applicant: Carrier Corporation, Palm Beach Gardens, FL (US)

(72) Inventor: Ramon de la Torre, Barcelona (ES)

(73) Assignee: CARRIER CORPORATION, Palm Beach Gardens, FL (US)

( * ) Notice: Subject to any disclaimer, the term of this patent is extended or adjusted under 35 U.S.C. 154(b) by 0 days.

(21) Appl. No.: 17/541,536

(22) Filed: Dec. 3, 2021

(65) Prior Publication Data

US 2022/0180714 A1 Jun. 9, 2022

(30) Foreign Application Priority Data

Dec. 4, 2020 (EP) .................................. 20383062

(51) Int. Cl.
| | |
|---|---|
| *G08B 3/10* | (2006.01) |
| *H03G 3/32* | (2006.01) |
| *G08B 29/24* | (2006.01) |
| *G08B 29/22* | (2006.01) |
| *G08B 17/00* | (2006.01) |

(52) U.S. Cl.
CPC ............... *G08B 3/10* (2013.01); *G08B 17/00* (2013.01); *G08B 29/22* (2013.01); *G08B 29/24* (2013.01); *H03G 3/32* (2013.01)

(58) Field of Classification Search
CPC .......... G08B 3/10; G08B 17/00; G08B 29/22; G08B 29/24; G08B 3/00; G08B 29/20; H03G 3/32
See application file for complete search history.

(56) References Cited

U.S. PATENT DOCUMENTS

| | | | | |
|---|---|---|---|---|
| 3,656,158 A | * | 4/1972 | Goodwater | ............ G08B 29/10 340/288 |
| 4,052,720 A | * | 10/1977 | McGregor | ......... G08B 13/1672 340/522 |
| 5,656,990 A | * | 8/1997 | Schwimmer | ........ B60R 25/1001 340/542 |
| 2016/0247364 A1 | | 8/2016 | Herman et al. | |
| 2017/0039822 A1 | | 2/2017 | Schlesinger | |
| 2018/0253947 A1 | | 9/2018 | Muhsin et al. | |

OTHER PUBLICATIONS

European Search Report for application EP 20383062.5, dated May 14, 2021, 8 pages.

* cited by examiner

*Primary Examiner* — John A Tweel, Jr.
(74) *Attorney, Agent, or Firm* — Cantor Colburn LLP

(57) ABSTRACT

A sounder apparatus 100 includes a sounder 110 having at least two volume settings, at least one detector 120, a micro-controller wherein the micro controller is configured to receive an input signal from the at least one detector 120, and to control the volume setting of the sounder based on the input signal.

9 Claims, 3 Drawing Sheets

SOUNDER DYNAMIC VOLUME ADJUSTMENT

FOREIGN PRIORITY

This application claims priority to European Patent Application No. 20383062.5, filed Dec. 4, 2020, and all the benefits accruing therefrom under 35 U.S.C. § 119, the contents of which in its entirety are herein incorporated by reference.

TECHNICAL FIELD

The present disclosure relates to a sounder apparatus and methods for controlling the volume of a sounder.

BACKGROUND

Sounders used in alarm or alert systems typically have a very loud volume, the generation of which requires substantial electrical power. The sounders must be loud enough to be heard by all occupants of a room and typically must be loud enough to meet the relevant imposed safety standards.

It is known to provide sounders with adjustable volume. An installer may set the volume of the sounder during installation of the sounder. The volume selected will depend on parameters relating to the surrounding environment, such as volume of ambient sound, or if installation is not carried out during normal conditions, the expected volume of ambient sound during those normal conditions, the size of the room and the occupancy of the room. In doing so the installer will likely have to estimate these parameters. Such estimation introduces errors into the selection of the most appropriate volume, and once set is not reactive to any changes in the environment which may occur and which may affect the volume that is most appropriate for the sounder.

It has been found that the effectiveness and energy efficiency of a sounder can be improved by providing better control of the volume and better tailoring this volume to the environment on a dynamic basis.

SUMMARY

According to a first aspect of the present invention, there is provided a sounder apparatus comprising a sounder having at least two volume settings, at least one detector and a micro-controller; wherein the micro-controller is configured to receive an input signal from the at least one detector, and to control the volume setting of the sounder based on the input signal.

The volume of the sounder may therefore be automatically adjusted to be the most appropriate volume, and advantageously this may be done dynamically to allow for automatic adjustment upon installation and/or during use of the sounder to adapt to changing conditions in an environment in which the sounder is installed. By enabling the process of volume selection and adjustment to be automatic instead of being manually carried out by an installer the effects of human error in setting the volume to an unintended volume are removed. Furthermore, because the automatic process is based on parameters measured by detectors the need for an installer to make an estimation of the most appropriate volume based only on their perception of the environment is removed, hence the ability to select a volume that is not the most appropriate volume for the sounder's setting is removed. In the case where an installer may use additional equipment to measure the environmental parameters during installation of the sounder, such a process is reduced in complexity and generally made more efficient through the automatic process of the present invention. By altering the volume of the sounder reactive to changes in the environment throughout the sounder's use, the energy consumption of the sounder can be reduced whilst maintaining a safe use. The volume should be loud enough that it raises a sufficient alarm and is detectable by persons in the area concerned by the event triggering the alarm. Generally this volume level is dictated by certain protocols, guidelines, or safety standards. However, since a high volume of the sounder requires a high level of electrical power, the volume should not be unnecessarily high as this would not be an efficient use of energy. There is therefore a balance to strike in the selection of volume between energy efficiency and safety. It is particularly useful to control the volume of a sounder in this dynamic and automatic way when the sounder apparatus is powered by batteries.

The efficacy of the sound as an alarm is dependent on environmental parameters such as the size of the room or space and the distance a person may be from a sounder, hence the number of sounders in the room or space, as well as the ambient or background noise level within the room or space. Environmental parameters such as room size may be particularly relevant when adhering to a specific protocol or standard. The environment in which the sounder is installed may be a dynamic space. For example: the number of people occupying the space may change; the type, and consequently the volume, of activities being carried out in the space may change; the volume of the ambient or background sound may change; the size of the space may change, for instance when rearranging movable walls in an office, or when creating partitions in a sports hall to alter the court sizes. It is therefore beneficial to provide the capability to tailor the volume of the sounder in a dynamic way and to enable automatic re-assessment the most appropriate volume throughout the lifetime of the sounder.

By using one or more detectors of appropriate type(s) some environmental parameters can be taken into account that would otherwise not be considered or well assessed by an installer. For example, noises and background sounds that do not occur during the installer's time in the environment cannot be accurately accounted for, and, the size of a room may be difficult to measure particularly depending on its size and shape.

The sounder may have at least three volume settings, or four or more volume settings, or the sounder may have a continuously adjustable volume (e.g. via a variable resistor). This would advantageously allow for an increased adaptability of the sounder apparatus and would allow the volume to be more specifically tailored to the measured environmental parameters.

The sounder apparatus may further comprise a potentiometer for manual input of a desired volume, wherein the micro controller receives an input signal from the potentiometer and is further configured to control the volume setting of the speaker based on the input signal from the potentiometer. The potentiometer can be controlled by an installer or a user so that the sounder apparatus can accept manual input from a user. This manual input can either override the micro-controller's setting of volume based on the input signal from the detectors, or, the input from the potentiometer can be combined with the input signals from the detectors to increase the reliability of the micro-controller's selection of the volume for the sounder.

At least one detector may be a detector for detecting ambient sound. For example the detector may be a microphone. The volume of the sounder must be sufficient so as to be heard over the ambient sound of the room. By receiving data concerning the ambient or background volume of the space, the micro-controller can ensure that the volume of the sounder is higher than the volume of the ambient sound, and sufficiently higher such that the sounder alarm is recognised by all persons occupying the space. The volume of the sounder may be controlled such that the sounder is at a volume that is a predetermined amount greater than the ambient sound. The predetermined difference may be set by the safety standards to which the sounder must adhere. The difference in volume between the ambient sound and the sounder may be constant or linear with increasing ambient sound volume, or may be determined by some other function. The EN54-3 standard may define how the volume of the sounder is determined in relation to the ambient noise level. For example, the sounder may be required to have a volume at least 10 dB higher than the ambient noise level, whilst the sounder volume may not be permitted to be below 65 dB irrespective of the ambient noise level.

At least one detector may be a detector for detecting dimensions of a space and/or the spacial configuration of a space. For example, the detector may be a laser telemeter. The volume of the sounder should preferably be sufficient so as to be heard by all of the occupants of the room and be heard above a certain level by each occupant of a room, the further an occupant may be from the sounder, the louder the originating sound should be so that the sounder has the best performance. Certain safety regulations may require that the volume of the sounder is dependent on the size of the room and may dictate for example a minimum volume per area size. The size of the room may advantageously be monitored in order to allow for automatic adjustment with respect to changes in size of the room, such as for enabling compliance with the regulations. The configuration of the space may also be considered for example the layout of walls and corridors, the arrangement of desks or other furniture, the extent of objects which may dampen the volume of the sounder etc. may impact the volume required by the sounder.

At least one detector may be a detector for detecting occupation of a space. For example, the detector may be an infrared detector, or a camera combined with image recognition software. Again the safety standards and protocols may dictate the required volume of the sounder depending on the occupation level of the space.

Optionally the sounder apparatus may comprise multiple detectors comprising either: the same type of detector, different types of detector, or a combination of the same and different types of detectors. In example embodiments in which the sounder apparatus includes multiple detectors of the same type, the detectors can be strategically placed in the environment so as to collect the most appropriate data, for example it may be known that a moveable wall is moved from or into position in a particular space and therefore a detector should be positioned in order to detect this, or it may be known that a room may be occupied in a specific region that may otherwise be missed by a detector placed in another area of the room. It also allows for a more reliable measure of the environmental parameters, such as by taking an average of the measurements or by gathering information on a finer scale.

In example embodiments in which the sounder apparatus includes detectors of different types more information can be used to determine the appropriate sounder volume. This increases the effectiveness of the dynamic volume control by compounding the inferred effect from different factors. This configuration also allows for a hierarchy of parameters so that an input signal from a certain detector type is deemed more important than an input signal from another detector type. The microcontroller may be configured to give preference to an input signal derived from a certain detector type, or may be configured to apply various weightings to the input signals derived from differing detector types. In this way further specialism of the sounder can be achieved tailored to its environment.

In some example embodiments the micro-controller controls the volume setting of the sounder based on the input signal from two or more detectors combined. By assessing the two or more input signals in combination the microcontroller can select the volume of the sounder taking into account multiple environmental parameters such that the volume of the sounder can be more specifically tailored to the environment as discussed in relation to the embodiments which include multiple detectors.

In some example embodiments, when the micro-controller receives an input signal from at least one detector and an input signal from the potentiometer, the micro-controller controls the volume of the sounder based on the input from the potentiometer combined with the input signal from the at least one detector. The input signals may be combined in a way such that the microcontroller selects an appropriate volume based on the input signal(s) from the detector(s) but with a minimum volume level dictated by the input signal from the potentiometer. This can be advantageous, for instance, if the user is aware of additional parameters that the detectors cannot detect. For example, knowledge of a person occupying the space who is hard of hearing may not be a detectable parameter, however a user can manually input a setting such as a minimum volume of the sounder using the potentiometer. In another exemplary scenario the user may wish to override the micro-controller's selection of volume based on the input signal from the detector(s) if it is known a particularly hazardous process is being carried out and the user may wish the volume to be at its highest as a precaution. The input signals of the detector(s) and the potentiometer may be combined in other ways such as by amalgamation of the input signals so that the input signal from the potentiometer is considered by the microprocessor as an additional factor along with the input signal(s) from the detector(s).

In some example embodiments, when the micro-controller receives an input signal from at least one detector and an input signal from the potentiometer, the microcontroller controls the volume of the sounder based on the potentiometer input which overrides the input signal from the at least one detector. There may arise a situation where the user requires a specific volume of the sounder independent of the volume that is required in response to the input signals from the detectors. By having the input signal from the potentiometer override those from the detector(s) the user's desired volume can be applied to the sounder.

The sensor apparatus may continually monitor the environment via the detector(s) with input signals continually provided to the micro-controller. The detector may be continually active. This may be done via suitable arrangement of the detectors and/or the micro-controller, taking account of any control circuitry that may be provided as a part of the detector. For example, the sampling rate of the input signal provided to the micro-controller from the detectors may be sufficiently high so that there is minimal lag between measurable changes occurring in the environment and them being detected, and thus it may be considered to be continuous as distinct from a periodic measurement as discussed below. In some examples the detectors may be continually active and may report a change in the environment whenever a response is detected which differs substantially from the previous responses. For instance, sensors detecting such a change will generate a pulse that the microcontroller can process, therefore there is no need to monitor the signal but to read those pulses or any change in the line. To ensure the volume of the sounder is constantly set at the correct level so that no time is wasted by the sounder sounding at an incorrect volume before being rectified, the detectors may operate continually. This ensures a high level of safety. Operating the detectors continually may be particularly useful in a high risk environment and in an environment for which the occupancy, ambient sound or spacial arrangement is frequently changing. Advantageously the power consumed by the detectors is typically much lower than the power required by the sounder, as such the energy efficiency of the system may still be increased by ensuring the sounder does not sound at an unnecessarily high volume, even with the detectors operating constantly.

The sensor apparatus may periodically monitor the environment via the detector(s) and with input signals provided to the micro-controller on a periodic basis. The periodic monitoring may comprise measurements taken at intervals, such as an interval in the range 5 minutes to 1 hour, for example every 10 minutes or every 30 minutes. The detector(s) may be activated periodically and/or the microcontroller may only access the input signal periodically. It may be advantageous to reduce the energy consumption of the system by having the detectors operating on a periodic time scale so that the volume of the sounder can be updated on a regular, but not constant, basis. Power usage can be reduced by only activating the detector(s) periodically and by otherwise deactivating them so that no power is used in the intervals when measurements are not taken. For example, it may be known that the conditions of the environment do not change on a short time scale, and therefore the volume of the sounder may only need to be updated periodically to ensure an appropriate volume is set.

The detectors may monitor the environment and provide input signals to the micro-controller only when the sounder is sounding. In this way energy consumption by the detectors is minimised. The volume of the sounder is determined by the parameters of the environment as the sounder is sounding (the most relevant time), but advantageously the detectors are not operating when the volume of the sounder need not be determined since it is not sounding. Using this operation condition, the sounder may sound for a short, but typically negligible, length of time at an incorrect volume. A balance is to be struck between energy efficiency of the sounder apparatus and reliability of the volume selection process. Such a balance will depend on the particular setting for the sounder apparatus and the safety risk involved, as well as the power supply to the system.

The operation of the sounder apparatus may be changeable between these settings to allow the user to select the desired or most appropriate setting.

In some examples, the sounder apparatus is contained in a single housing. In this way the sounder, microcontroller and detector(s) may be integrated within a single device. In example embodiments in which a potentiometer is present, the potentiometer may also be integrated within the same device as the sounder, microcontroller and detector(s). The sounder apparatus may be contained in the same housing by mounting each component to the same substrate. By providing the apparatus in a single, self-contained device, easier installation and maintenance of the devices can be achieved.

The sounder apparatus may use the same power supply for all of its components. Thus, the speaker, the detector(s) and the microcontroller may have a common power supply, such as via being connected to the same battery and/or the same external power source.

In other examples the detectors may be provided and installed separately to the sounder and microprocessor so that the detectors may be positioned in the most effective or appropriate location. For example the potentiometer may be at an easy to reach position owing to its manual control, whilst a detector for detecting the dimensions of a space may need to be placed considering potential blind spots created by the layout of the space and a detector for detecting the volume of ambient noise in a space should not be placed in close proximity to an entity generating noise, and the sounder should be placed most likely at a central region of the space. The detectors and the microcontroller may communicate in any suitable way through wired or wireless communication systems using any suitable protocols via direct transmission and or within a mesh network, such as Bluetooth, ZigBee, Wi-Fi, or any of various wired networks.

The apparatus of the first aspect may be implemented as a part of a fire alarm system, the system comprising: a fire or heat detection means, a processor and the sounder apparatus of the first aspect, wherein the processor is configured to instruct the sounder apparatus to sound when fire is detected, or when a test of the fire alarm system is being carried out. The fire alarm system may be for a building, in which case the sounder apparatus may be for installation within a building. The invention also extends, in example embodiments, to a building including the alarm system.

The fire alarm system may further comprise a heat detector or a smoke detector for detection of a possible fire. When heat or smoke is detected at a level indicative of the presence of a fire, the processor instructs the sounder to sound, creating an audible alarm. The sounder apparatus is hence used for alerting people to a fire and warning people of danger. Incorporation of the sounder apparatus of the present invention in a fire alarm system improves the safety of the fire alarm by ensuring that the audible alarm operates at a high enough volume to be effective, whilst minimising energy costs and reducing the error involved in one-time manual set up of the sounder volume.

The sounder apparatus may also be implemented in other alarm or warning systems for example carbon monoxide alarms as well as other hazardous chemical alarms, burglar or intruder alarms, radiation alarms etc.

A fire alarm system, or other alarm system, as discussed above may optionally comprise a sounder with any of the other features discussed above in connection with the first aspect.

The fire alarm system may comprise at least two sounder apparatus for installation in multiple separate locations, for example multiple different areas of a building. The volume of each of the multiple sounders may be independently controlled by its respective microprocessor and hence the volume depends on the input signals from its respective detectors. Therefore the volume of each sounder is tailored to its own environment whilst being within a single fire alarm system. Example embodiments may comprise a building with an alarm system comprising at least two sounder apparatus as in the first aspect or optional features thereof. The at least two sounder apparatus may have their volume settings automatically adjusted based on the signal inputs from their respective detectors monitoring their respective location.

Examples in which the use of multiple sounder apparatus of the present invention within a fire alarm system installed in a building would be advantageous include scenarios such as school buildings where rooms may be of comparable size but provided for different purposes. An installer may select the same sounder volume for each room based on their comparable size, however during use one room may be purposed as a staff room and occupied by periodically by quietly chatting school staff, the other may be a classroom occupied by loud small children. In addition, the usage of the rooms may change after installation of the alarm system. The sounder apparatus of the present invention would allow the sounder volume to automatically and dynamically adapt to these differences, whereas a manually pre-set sounder would not.

The apparatus of the first aspect may be implemented along with a surround sound system comprising a controller and at least two speakers, wherein at least one of the at least two speakers comprises the sounder apparatus of the first aspect of the present invention. The controller may be configured to send a signal to the speakers, the signal instructing each speaker on what sound should be made. The sounder(s) of the present invention may also act as conventional speaker(s) in the surround sound system and may be configured, as per the present invention, to control or adapt their respective volume based on the signals received from the detector or detectors comprised in the sounder apparatus. In this way greater control over the volume of the speakers can be achieved to provide a more effective surround sound, for example because noise produced by each speaker is heard at the appropriate or intended level by the listener regardless of the environmental parameters of the region or space in which each speaker is placed. A surround sound system can be used to produce the effect on a listener that sound emanating from the speakers of the system originates from different points around them. The complete track or sound can be divided into a number of tracks comprising the constituent parts of the complete track at different volume levels. In this way specific sounds can be played through a speaker in a specific position creating the effect that the sound originating from that position at the same time as sound originates from another position. A higher quality surround sound is achieved by employing the volume control ability of the sounder of the present invention because the effect of the sound being 'drowned out' by environmental factors surrounding a sounder, or speaker, is reduced. Likewise, by employing the volume control ability of the sounder of the present invention the volume from a speaker does not become overpowering if the sounder is placed in a region having a reduced effect on the audibility compared to regions of the other sounders.

For example, a sounder, or speaker, placed in a region of high background noise may increase its volume whilst a sounder, or speaker, placed in a region of low background noise may decrease its volume so that the overall effect of the surround sound is balanced. This ensures each part of the surround sound audio output is heard by listeners at the desired level. Similarly other factors affecting the audibility of the noise from the sounder, or speaker, can also be taken into consideration using the various detector types that may be integrated into the sound apparatus as discussed above. The surround sound system may comprise 3 or 4 or 5 or more sounders, or speakers, based on the desired effect of the surround sound, the size of the space to be covered by the surround sound and other factors.

Viewed from a second aspect, the invention provides a method of controlling a sounder apparatus, the sounder apparatus comprising a sounder having a speaker with at least two volume settings, at least one detector and a microcontroller, the method comprising; the at least one detector transmitting an input signal, the microcontroller receiving the input signal, and the micro controller controlling the volume of the sounder based on the input signal. The method may include the use of a sounder system having other features as discussed above in connection with optional features of the first aspect, and may comprise use of an alarm system as above, such as a fire alarm system within a building.

The micro-controller may therefore control the volume of the sounder to be the most appropriate volume automatically. Advantageously this may be done dynamically to allow for automatic adjustment upon installation and/or during use of the sounder to adapt to changing conditions in an environment in which the sounder is installed. By enabling the process of volume selection and adjustment to be automatic instead of being manually carried out by an installer the effects of human error in setting the volume to an unintended volume are removed. Furthermore, because the automatic process is based on parameters measured by detectors the need for an installer to make an estimation of the most appropriate volume based only on their perception of the environment is removed, hence the ability to select a volume that is not the most appropriate volume for the sounder's setting is removed. In the case where an installer may use additional equipment to measure the environmental parameters during installation of the sounder, such a process is reduced in complexity and generally made more efficient through the automatic process of the present invention. By altering the volume of the sounder reactive to changes in the environment throughout the sounder's use, the energy consumption of the sounder can be reduced whilst maintaining a safe use. The volume should be loud enough that it raises a sufficient alarm and is detectable by persons in the area concerned by the event triggering the alarm. Generally this volume level is dictated by certain protocols, guidelines, or safety standards. However, since a high volume of the sounder requires a high level of electrical power, the volume should not be unnecessarily high as this would not be an efficient use of energy. There is therefore a balance to strike in the selection of volume between energy efficiency and safety. It is particularly useful to control the volume of a sounder in this dynamic and automatic way when the sounder apparatus is powered by batteries.

The efficacy of the sound produced by the sounder as an alarm is dependent on environmental parameters such as the size of the room or space and the distance a person may be from a sounder, and hence is dependent on the number of sounders in the room or space, as well as the ambient or background noise level within the room or space. Environmental parameters such as room size may be particularly relevant when adhering to a specific protocol or standard. The environment in which the sounder is installed may be a dynamic space. For example: the number of people occupying the space may change; the type, and consequently the volume, of activities being carried out in the space may change; the volume of the ambient or background sound may change; the size of the space may change, for instance when rearranging movable walls in an office, or when creating partitions in a sports hall to alter the court sizes. It is therefore beneficial to provide the capability to tailor the volume of the sounder in a dynamic way and to enable automatic re-assessment of the most appropriate volume throughout the lifetime of the sounder.

By using one or more detectors of appropriate type(s) some environmental parameters can be taken into account that would otherwise not be considered or well assessed by an installer. For example, noises and background sounds that do not occur during the installer's time in the environment cannot be accurately accounted for, and, the size of a room may be difficult to measure particularly depending on its size and shape.

The microcontroller may select one of at least three volume settings, or four or more volume settings of the sounder, or may select a volume from a continuously adjustable volume of the sounder (e.g. if the volume adjuster for the sounder comprised a variable resistor). This would advantageously allow the volume to be more specifically tailored to the measured environmental parameters.

The microcontroller may receive further input signals from a potentiometer, the microcontroller controls the volume setting of the sounder based on the input signal from the potentiometer. An installer or user may control the potentiometer so that the volume of the sounder can be controlled, via the microprocessor, by manual input from a user. The microprocessor can either use the manual input from the potentiometer to override setting of volume based on the input signal from the detectors, or, the microprocessor can combine the input from the potentiometer with the input signals from the detectors to increase the reliability of the micro-controller's selection of the volume for the sounder.

The method may include at least one detector detecting the ambient sound. For example the detector may be a microphone. The volume of the sounder must be sufficient so as to be heard over the ambient sound of the room. By receiving data concerning the ambient or background volume of the space, the micro-controller can select a volume that ensures that the volume of the sounder is higher than the volume of the ambient sound, and sufficiently higher such that the sounder alarm is recognised by all persons occupying the space. The volume of the sounder may be controlled such that the sounder is at a volume that is a predetermined amount greater than the ambient sound. The predetermined difference may be set by the safety standards to which the sounder must adhere. The difference in volume between the ambient sound and the sounder may be constant or linear with increasing ambient sound volume, or may be determined by some other function. The EN54-3 standard may define how the volume of the sounder is determined in relation to the ambient noise level. For example, the sounder may be required to have a volume at least 10 dB higher than the ambient noise level, whilst the sounder volume may not be permitted to be below 65 dB irrespective of the ambient noise level.

The method may include at least one detector detecting the dimensions of a space and/or the spacial configuration of a space. For example, the detector may be a laser telemeter. The volume of the sounder should preferably be sufficient so as to be heard by all of the occupants of the room and be heard above a certain level by each occupant of a room, the further an occupant may be from the sounder, the louder the originating sound should be so that the sounder has the best performance. Certain safety regulations may require that the volume of the sounder is dependent on the size of the room and may dictate for example a minimum volume per area size. The size of the room may advantageously be monitored in order to allow for automatic adjustment with respect to changes in size of the room, such as for enabling compliance with the regulations. The configuration of the space may also be considered, for example the layout of walls and corridors, the arrangement of desks or other furniture, the extent of objects which may dampen the volume of the sounder etc. may impact the volume required by the sounder.

The method may include at least one detector detecting the occupation of a space. For example, the detector may be an infrared detector, or a camera combined with image recognition software. Again the safety standards and protocols may dictate the required volume of the sounder depending on the occupation level of the space.

Optionally the microcontroller may receive input signals from multiple detectors, the input signals from each detector may be indicative of measurements of different environmental parameters, of the same environmental parameter, or of a combination of the same and different environmental parameters. In example embodiments in which the method includes the microcontroller receiving input signals from detectors measuring the same environmental parameter, the detectors can be strategically placed in the environment so as to collect the most appropriate data, for example it may be known that a moveable wall is moved from or into position in a particular space and therefore a detector should be positioned in order to detect this, or it may be known that a room may be occupied in a specific region that may otherwise be missed by a detector placed in another area of the room. It also allows for a more reliable measure of the environmental parameters, such as by taking an average of the measurements or by gathering information on a finer scale.

In example embodiments in which the microcontroller receives input signals from detectors measuring different environmental parameters more information can be used to determine the appropriate sounder volume. This increases the effectiveness of the dynamic volume control by compounding the inferred effect from different factors. This method also allows for a hierarchy of parameters so that an input signal from a detector measuring a certain environmental parameter is deemed more important than an input signal from a detector measuring a different environmental parameter. The microcontroller may give preference to an input signal indicative of certain environmental parameter, or may apply various weightings to the input signals indicative of different environmental parameters. In this way further specialism of the sounder can be achieved tailored to its environment.

In some example embodiments the method may include the microcontroller controlling the volume setting of the sounder based on the input signal received from two or more detectors combined. By assessing the two or more input signals in combination the microcontroller can select the volume of the sounder taking into account multiple environmental parameters such that the volume of the sounder can be more specifically tailored to the environment as discussed in relation to the embodiments which include receiving input signals from multiple detectors.

In some example embodiments, the method may include that when the micro-controller receives an input signal from at least one detector and an input signal from the potentiometer, the micro-controller controls the volume of the sounder based on the input from the potentiometer combined with the input signal from the at least one detector. The input signals may be combined in a way such that the microcontroller selects an appropriate volume based on the input signal(s) from the detector(s) but with a minimum volume level dictated by the input signal from the potentiometer. This can be advantageous, for instance, if the user is aware of additional parameters that the detectors cannot detect. For example, knowledge of a person occupying the space who is hard of hearing may not be a detectable parameter, however a user can manually input a setting such as a minimum volume of the sounder using the potentiometer. In another exemplary scenario the user may wish to override the microcontroller's selection of volume based on the input signal from the detector(s) if it is known a particularly hazardous process is being carried out and the user may wish the volume to be at its highest as a precaution. The input signals of the detector(s) and the potentiometer may be combined in other ways such as by amalgamation of the input signals so that the input signal from the potentiometer is considered by the microprocessor as an additional factor along with the input signal(s) from the detector(s).

In some example embodiments, the method may include that when the microcontroller receives an input signal from at least one detector and an input signal from the potentiometer, the microcontroller controls the volume of the sounder based on the potentiometer input which overrides the input signal from the at least one detector. There may arise a situation where the user requires a specific volume of the sounder independent of the volume that is required in response to the input signals from the detectors. By having the input signal from the potentiometer override those from the detector(s) the user's desired volume can be applied to the sounder.

The method may include that the sensor apparatus may continually monitor the environment via the detector(s) with input signals continually provided to the micro-controller. The detector may be continually active. This may be done via suitable programming of the detectors and/or the microcontroller, taking account of any control circuitry that may be provided as a part of the detector. For example, the sampling rate of the input signal provided to the microcontroller from the detectors may be sufficiently high so that there is minimal lag between measurable changes occurring in the environment and them being detected, and thus it may be considered to be continuous as distinct from a periodic measurement as discussed below. In some examples the detectors may be continually active and may report a change in the environment whenever a response is detected which differs substantially from the previous responses. For instance, sensors detecting such a change will generate a pulse that the microcontroller processes, therefore there is no need to monitor the signal but to read those pulses or any change in the line. To ensure the volume of the sounder is constantly set at the correct level so that no time is wasted by the sounder sounding at an incorrect volume before being rectified, the detectors may operate continually. This ensures a high level of safety. Operating the detectors continually may be particularly useful in a high risk environment and in an environment for which the occupancy, ambient sound or spacial arrangement is frequently changing. Advantageously the power consumed by the detectors is typically much lower than the power required by the sounder, as such the energy efficiency of the method may still be increased by ensuring the sounder does not sound at an unnecessarily high volume, even with the detectors operating constantly.

The method may include that the sensor apparatus periodically monitors the environment via the detector(s) and provides input signals to the micro-controller on a periodic basis. The periodic monitoring may comprise measurements taken at intervals, such as an interval in the range 5 minutes to 1 hour, for example every 10 minutes or every 30 minutes. The detector(s) may activate periodically and/or the microcontroller may only access the input signal periodically. It may be advantageous to reduce the energy consumption of the method by having the detectors operating on a periodic time scale so that the volume of the sounder can be updated on a regular, but not constant, basis. Power usage can be reduced by only activating the detector(s) periodically and by otherwise deactivating them so that no power is used in the intervals when measurements are not taken. For example, it may be known that the conditions of the environment do not change on a short time scale, and therefore the volume of the sounder may only need to be updated periodically to ensure an appropriate volume is set.

The method may include that the detectors monitor the environment and provide input signals to the microcontroller only when the sounder is sounding. In this way energy consumption by the detectors is minimised. The volume of the sounder is determined by the parameters of the environment as the sounder is sounding (the most relevant time), but advantageously the detectors are not operating when the volume of the sounder need not be determined since it is not sounding. Using this operation condition, the sounder may sound for a short, but typically negligible, length of time at an incorrect volume. A balance is to be struck between energy efficiency of the sounder apparatus and reliability of the volume selection process. Such a balance will depend on the particular setting for the sounder apparatus and the safety risk involved, as well as the power supply to the system.

The method of controlling the sounder apparatus may be changeable between these settings to allow the user to select the desired or most appropriate setting.

The detectors and the microcontroller may communicate in any suitable way through wired or wireless communication systems using any suitable protocols via direct transmission and or within a mesh network, such as Bluetooth, ZigBee, Wi-Fi, or any of various wired networks.

The method of the second aspect may be implemented along with a fire alarm system comprising a fire or heat detection means, a processor and the sounder apparatus of the first aspect of the present invention, wherein the processor instructs the sounder apparatus to sound when fire is detected, or when a test of the fire alarm system is being carried out. The fire alarm system may be installed in a building.

The fire alarm system may further comprise a heat detector or a smoke detector for detection of a possible fire so that when heat or smoke is detected at a level indicative of the presence of a fire, the processor instructs the sounder to sound, creating an audible alarm. The sounder apparatus is hence used for alerting people to a fire and warning people of danger. Incorporation of the method of controlling a sounder apparatus of the present invention implemented with a fire alarm system improves the safety of the fire alarm by ensuring that the audible alarm operates at a high enough volume to be effective, whilst minimising energy costs and reducing the error involved in one-time manual set up of the sounder volume.

The method of controlling a sounder apparatus may also be implemented in other alarm or warning systems for example carbon monoxide alarms as well as other hazardous chemical alarms, burglar or intruder alarms, radiation alarms etc.

The method of controlling a sounder apparatus of the present invention when implemented in a fire alarm system, or other alarm system, as discussed above may optionally comprise the method steps with any of the other features discussed above in connection with the second aspect.

The method of the present invention when implemented in a fire alarm system may comprise installing at least two sounder apparatus in multiple separate locations, for example multiple different areas of a building. The volume of each of the multiple sounders is independently controlled by its respective microprocessor and hence the volume of each sounder depends on the input signals from its respective detectors. Therefore the volume of each sounder is tailored to its own environment.

The method of controlling a sounder apparatus of the present invention would allow the volume of the sounder to be automatically and dynamically adapted to differences arising in a sounder's individual environment, whereas manually pre-setting a sounder would not.

The method of the second aspect may be implemented along with a surround sound system comprising a controller and at least two speakers, wherein at least one of the at least two speakers comprises the sounder apparatus of the first aspect of the present invention. The method may include the controller sending a signal to the speakers, the signal instructing each speaker on what sound should be made. The method of controlling a sounder of the present invention may be implemented so as to control or adapt the respective volume of a sounder in the surround sound system based on the signals received by the respective microprocessor from the detector or detectors comprised in the sounder apparatus. In this way greater control over the volume of the speakers can be achieved to provide a more effective surround sound, for example because noise produced by each speaker is heard at the appropriate or intended level by the listener regardless of the environmental parameters of the region or space in which each speaker is placed. A surround sound system can be used to produce the effect on a listener that sound emanating from the speakers of the system originates from different points around them. The complete track or sound can be divided into a number of tracks comprising the constituent parts of the complete track at different volume levels. In this way specific sounds can be played through a speaker in a specific position creating the effect that the sound originating from that position at the same time as sound originates from another position. A higher quality surround sound is achieved by employing the volume control ability of the sounder of the present invention because the effect of the sound being 'drowned out' by environmental factors surrounding a sounder, or speaker, is reduced. Likewise, by employing the volume control ability of the sounder of the present invention the volume from a speaker does not become overpowering if the sounder is placed in a region having a reduced effect on the audibility compared to regions of the other sounders.

For example, a sounder, or speaker, placed in a region of high background noise may increase its volume whilst a sounder, or speaker, placed in a region of low background noise may decrease its volume so that the overall effect of the surround sound is balanced. This ensures each part of the surround sound audio output is heard by listeners at the desired level. Similarly other factors affecting the audibility of the noise from the sounder, or speaker, can also be taken into consideration using the various detector types that may be integrated into the sound apparatus as discussed above. The surround sound system may comprise 3 or 4 or 5 or more sounders, or speakers, based on the desired effect of the surround sound, the size of the space to be covered by the surround sound and other factors.

The sounder apparatus may be one of multiple sounder apparatus each disposed within separate locations of a building or space; wherein the multiple sounder apparatus are parts of a fire alarm system that also comprises at least one fire or heat detection means and a processor; wherein the processor is configured to instruct the sounder apparatus to sound when fire is detected, or when a test is being carried out; and wherein for each sounder the respective microcontroller controls the volume of the respective sounder based on the respective input signal in order that each sounder can have a differing volume setting that is automatically adjusted based on the input signal from the detector(s). Thus, the method may include automatically adjusting the sounder volume setting independently for each of multiple sounders within an alarm system.

BRIEF DESCRIPTION OF THE DRAWINGS

Certain embodiments of the invention will now be described by way of example only and with reference to the accompanying drawings in which.

DETAILED DESCRIPTION

Figure 1:
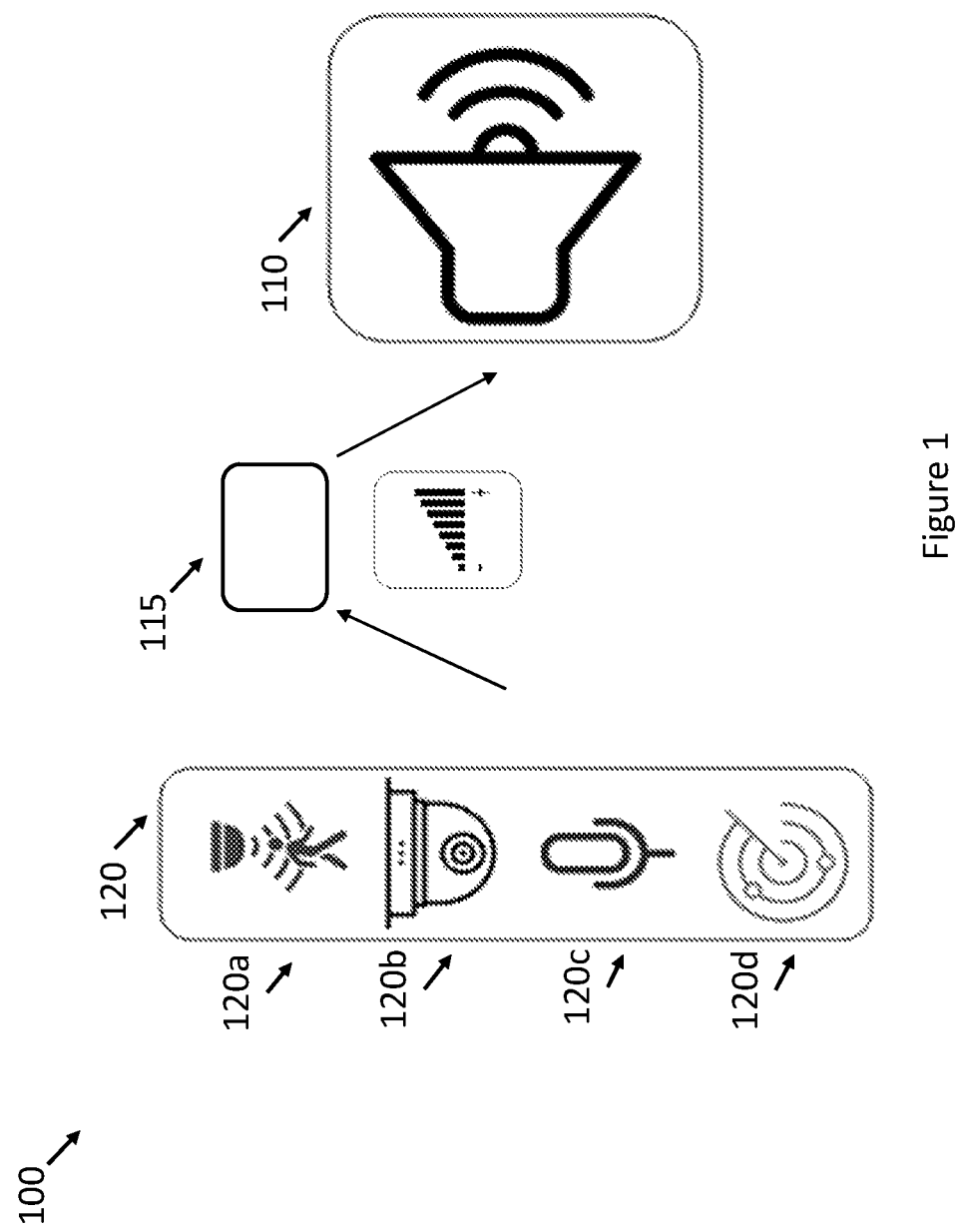
FIG. 1 is a schematic depiction of a sounder apparatus in which a speaker is combined with detectors.

As seen in FIG. 1, a sounder apparatus 100 comprises a sounder 100 combined with detectors 120. The volume of the sounder 110 is controlled by a micro-controller 115 depending on the measurements made by the detectors 120. The detectors 120 may be a detector 120a for detecting the occupation of a space, a detector 120b for detecting the dimensions of a space, a detector 120c for detecting the ambient or background noise of a space, and/or a detector 120d for detecting the spacial configuration of a space.

During installation of the sounder apparatus 100 the sounder 110 and micro-controller 115 can be installed in position in a space, room or building. In examples where the detectors 120 are separate to the micro-controller 115 and the sounder 110, the detectors 120 may be installed in optimal positions around a room so that they can effectively monitor changes in the environment that affect the audibility of the sounder 110. In other examples the detectors 120 may be integrated with the sounder 110 and micro-controller 115, and therefore disposed in the same housing, so that they are installed as the sounder 110 is installed.

During use, the detector(s) 120 take a measurement of the relevant environment parameter and sends this information as an input signal to the micro-controller 115. The micro-controller 115 analyses the input signal and determines the most appropriate volume for the sounder 110 based on this input signal, the micro-controller 115 then sets the sounder to the determined volume. The detectors 120 may take repeat measurements throughout use of the sounder 110, and correspondingly, the micro-controller 115 reassesses the appropriate volume for the sounder 110 and changes the volume setting of the sounder 110 where necessary when the appropriate volume determined by the micro-controller 115 has changed. For example the size, background or ambient sound, occupation or spacial configuration of the space in which the sounder apparatus 100 is installed may change throughout use of the apparatus 100. Factors such as these can affect the audibility of the sounder 110 and volume of the sounder 110 may need to be adjusted accordingly. The efficiency of the sounder 110 is increased by monitoring the environment and changing the volume of the sounder 110 accordingly since the sounder 110 requires a high power. Therefore with a volume setting unnecessarily high, a large amount of energy is wasted when the sounder 110 is sounding. Although the detectors 120 require energy to operate, the power required by the detectors 120 is significantly lower than the sounder 110 meaning that the overall efficiency of the system is still increased. The volume of the sounder 110 should be high enough so as to be heard by occupants of a room and so as to meet the requirements of the relevant safety standards to which it is required to comply, but should not be too high so as to waste energy. The automatic measuring and updating capabilities of the sounder apparatus 100 of the present invention allows for a dynamic response to changes in the environment ensuring optimal efficiency of the sounder apparatus 100 is maintained.

Figure 2:
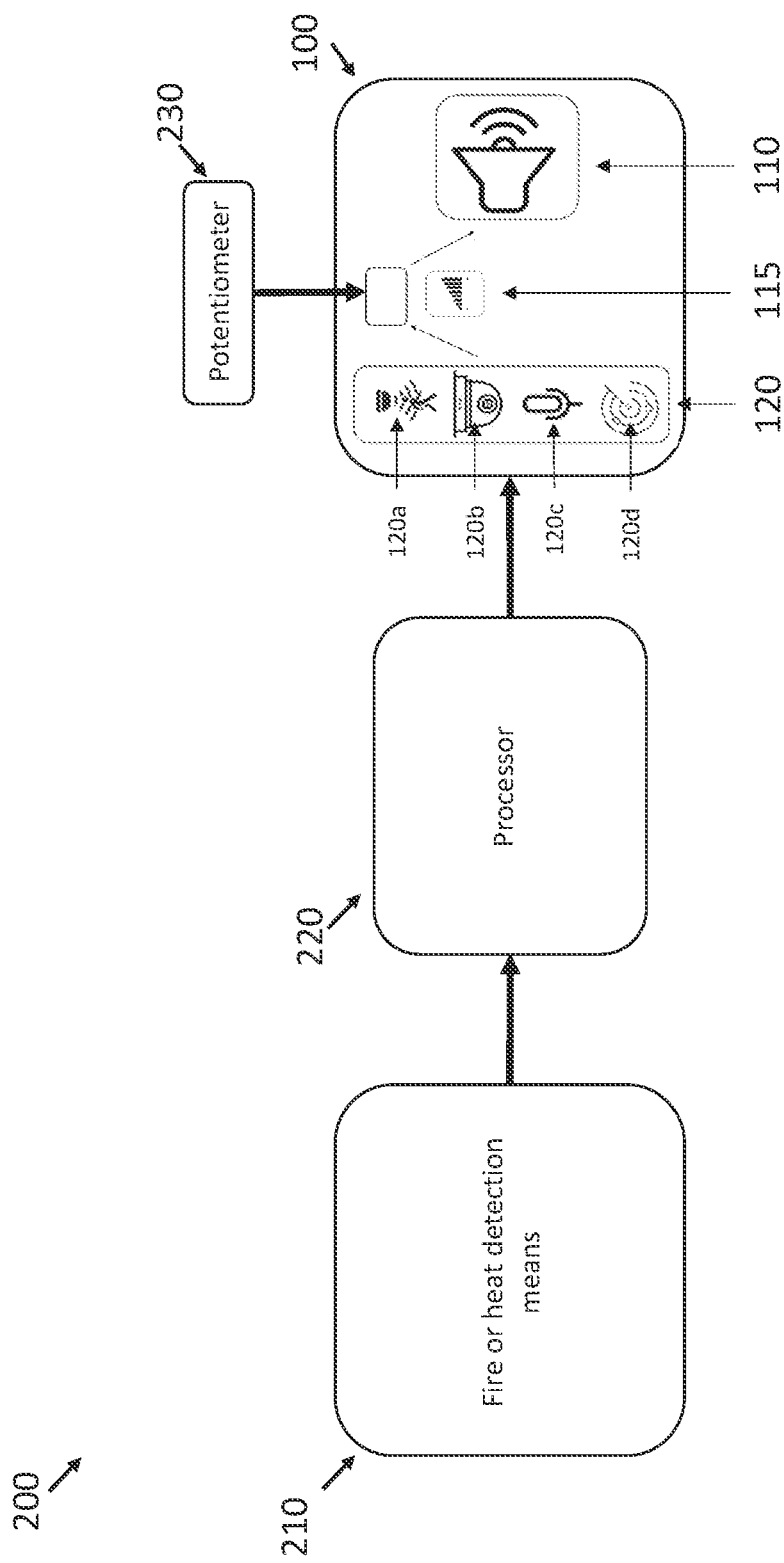
FIG. 2 is a schematic of a fire alarm system comprising the sounder apparatus.

As seen in FIG. 2 a fire alarm system 200 can comprise the sounder apparatus 100. The fire or heat detection means 210 is in communication with the processor 220 which in turn is in communication with the sounder apparatus 100. The processor 220 may be integrated with the fire or heat detection means 210. Once the fire or heat detection means 210 detects signs of a fire, the processor is configured to instruct the sounder apparatus 100 to sound. Likewise, if the fire or heat detection means is placed in a test condition the processor is configured to instruct the sounder apparatus 100 to sound. As in the first aspect of the present invention, the sounder 110 will sound at a volume controlled by the micro-controller 115 depending on the measurements made by the detectors 120. The sounder apparatus 100 therefore acts as an alert system for warning of a fire. A potentiometer 230 is provided for manual input of a desired volume of the sounder 110. The micro controller 115 receives an input signal from the potentiometer 230 and the micro controller 115 is configured to control the volume setting of the sounder 110 based on the input signal from the potentiometer 230.

Figure 3:
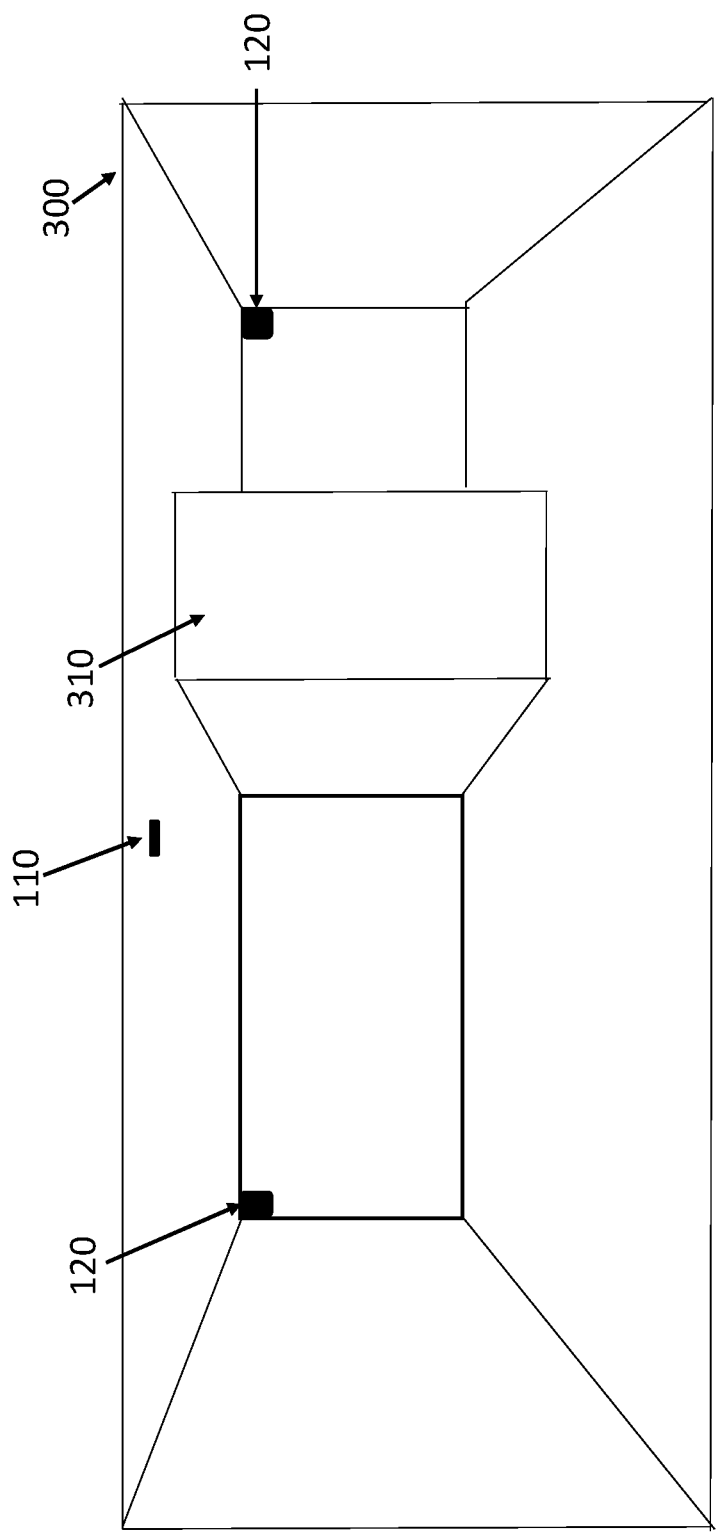
FIG. 3 is a schematic depiction of a sounder apparatus installed in a room.

As seen in FIG. 3 the fire alarm system 200 may be installed in a room 300 of a building. The detectors 120 of the sounder apparatus may be installed in various positions in the room. For example in FIG. 3 the detectors 120 are positioned in different corners of the room. In this example a partition wall 310 in the room 300 may block the field of view of an individual detector 120, however by installing multiple detectors the area of the room 300 can be more completely covered by the detectors 120 of the sounder apparatus 100. The sounder 110 may be installed in an appropriate position in the room, such as on the ceiling, so as to be accessible and so as to have a clear path for the sound to enter the room. The fire or heat detection means 210 and the processor 220 may also be installed in an appropriate position so as to optimise the detection of fire in the area and hence the safety of the fire alarm system. The position of the fire or heat detection means may or may not be the same position as the sounder 110 or any other components of the sounder apparatus 100. The fire or heat detection means may be integrated with a detector(s) 120 and/or the sounder 110 of the sounder apparatus.

In some instances the partition wall 310 may be moveable. In this case when the wall is moved, a detector 120 for detecting the dimensions or the spatial configuration of a space will be able to detect such a change and will automatically cause the volume of the sounder 110 to be adjusted accordingly.

As discussed above, the sounder 110 may be a part of a surround sound system (not shown in the Figures). In that case there may be surround sound speakers located within a room of a building, such as in a typical array used for conventional surround sound purposes, and one or more of the surround sound speakers may form the sounder 110 for the present system. Thus, the surround sound speakers may become a part of an alarm system with adaptive sound levels as discussed above.

What is claimed is:

1. A fire alarm system comprising,
   a fire or heat detection means,
   a processor, and
   a plurality of sounder apparatus, each of the plurality of sounder apparatus is contained within a single housing and is disposed within separate locations of a building or space, each of the plurality of sounder apparatus comprising,
   a sounder having at least two volume settings,
   at least one detector,
   a micro-controller, and
   a potentiometer for manual input of a desired volume,
   wherein the micro controller is configured to receive an input signal from the at least one detector and receive an input signal from the potentiometer, and is further configured to control the volume setting of the sounder based on the input signal from the potentiometer combined with the input signal from the at least one detector; and
   wherein the processor is configured to instruct the sounder apparatus to sound when the fire is detected, or when a test is being carried out.

2. A fire alarm system as claimed in claim 1, wherein when the micro-controller receives an input signal from at least one detector and an input signal from the potentiometer, the micro-controller controls the volume of the sounder based on the potentiometer input which overrides the input signal from the at least one detector.

3. A fire alarm system as claimed in claim 1, wherein the at least one detector includes one or more of: a detector for detecting the volume of ambient sound in the space, a detector for detecting the dimensions of a space, a detector for detecting the spatial configuration of a space and/or a detector for detecting the occupation of a space.

4. A fire alarm system as claimed in claim 1, further comprising multiple detectors that comprise either: the same type of detector, different types of detector, or a combination of the same and different types of detectors.

5. A fire alarm system as claimed in claim 4, wherein the micro-controller controls the volume setting of the sounder based on the input signal from two or more detectors when combined.

6. A fire alarm system as claimed in claim 1, wherein the sounder apparatus is arranged to continually monitor the environment via the detector with input signals continually provided to the micro-controller.

7. A fire alarm system as claimed in claim 1, wherein the sounder apparatus is arranged to periodically monitor the environment with input signals provided to the micro-controller on a periodic basis.

8. A fire alarm system as claimed in claim 1, wherein the at least one detector monitors the environment and provide input signals to the micro-controller only when the sounder is sounding.

9. A method of controlling a fire alarm system, the fire alarm system comprising
   a fire or heat detection means,
   a processor, and
   a plurality of sounder apparatus, each of the plurality of sounder apparatus comprising a sounder, at least one detector and a microcontroller; the method comprising:

at least one detector transmitting an input signal, the microcontroller receiving the input signal, the microcontroller controlling the volume of the sounder based on the input signal, and the processor instructing the sounder apparatus to sound when fire is detected or when a test is being carried out, wherein multiple of the plurality of sounder apparatus are disposed within separate locations of a building or space, and for each sounder the respective microcontroller receives input signals from the at least one detector of the respective sounder apparatus and controls the volume setting of the respective sounder based on the respective input signal in order that each sounder can have a differing volume setting that is automatically adjusted based on the input signal from the respective detector(s).

\* \* \* \* \*